US006886962B2

(12) United States Patent
Suehiro

(10) Patent No.: US 6,886,962 B2
(45) Date of Patent: May 3, 2005

(54) SHIELDED REFLECTIVE LIGHT-EMITTING DIODE

(75) Inventor: Yoshinobu Suehiro, Nishikasugai-gun (JP)

(73) Assignee: Toyoda Gosei Co., Ltd., Aichi (JP)

( * ) Notice: Subject to any disclaimer, the term of this patent is extended or adjusted under 35 U.S.C. 154(b) by 83 days.

(21) Appl. No.: 10/179,377

(22) Filed: Jun. 26, 2002

(65) Prior Publication Data

US 2003/0002281 A1 Jan. 2, 2003

(30) Foreign Application Priority Data

Jun. 27, 2001 (JP) .................................. P2001-194590
Oct. 4, 2001 (JP) .................................. P2001-308256

(51) Int. Cl.[7] ................................................ F21V 1/00
(52) U.S. Cl. ...................... 362/241; 362/235; 362/240; 362/249; 362/248; 362/341; 362/347; 362/800; 362/301; 362/303; 313/500; 313/512
(58) Field of Search ................................ 362/241, 235, 362/240, 249, 248, 341, 347, 800, 301, 303, 343, 305, 354; 313/500, 512

(56) References Cited

U.S. PATENT DOCUMENTS

2002/0024808 A1 * 2/2002 Suehiro et al. ............. 362/245

FOREIGN PATENT DOCUMENTS

| EP | 1 146 572 A2 | 10/2001 |
| EP | 1 235 281 A1 | 8/2002 |
| EP | 1 249 877 A2 | 10/2002 |
| GB | 2 324 598 | 10/1998 |
| JP | 2000 299502 | 10/2000 |

OTHER PUBLICATIONS

European Search Report dated May 14, 2004.

* cited by examiner

Primary Examiner—Stephen Husar
Assistant Examiner—Bertrand Zeade
(74) Attorney, Agent, or Firm—McGinn & Gibb, PLLC

(57) ABSTRACT

In a shielded reflective LED, each of light sources can be surface-mounted substantially without being influenced by heat distortion based on the difference in thermal expansion coefficient between resin and metal because the light source is so small-sized that only one light-emitting element is sealed with a resin. Moreover, variations in luminous intensity and chromaticity of each of light-emitting elements used in three-color light sources can be examined in advance. Hence, well-matched three-color light sources can be mounted in combination so that display unevenness of a full color display can be reduced greatly. Further, the surface of the substrate portion on which the light source is fixed is silk-screen-printed in black. Hence, external light which enters the device through the optical opening portion when the device is turned off is reflected by the reflecting mirror and absorbed to the surface of the substrate portion. As a result, pseudo-lighting in which external light is radiated out again through the optical opening portion can be prevented thoroughly, so that contrast between light when the device is turned on and light when the device is turned off can be made high.

20 Claims, 7 Drawing Sheets

SHIELDED REFLECTIVE LIGHT-EMITTING DIODE

The present application is based on Japanese Patent Applications No. 2001-194590 and 2001-308256, which are incorporated herein by reference.

BACKGROUND OF THE INVENTION

1. Field of Invention

The present invention relates to a shielded reflective light-emitting diode (hereinafter also referred to as "shielded reflective LED") having a light source including a light-emitting element, a reflecting mirror provided opposite to the light source, and a light-shielding member. Incidentally, in this specification, an LED chip itself is called a "light-emitting element", a light-emitting substance including an optical device such as a package resin or a lens system in which an LED chip is mounted is called a "light source", and a light-emitting device having a light source mounted therein is called a "light-emitting diode" or an "LED" as a whole.

2. Description of the Related Art

As a light-emitting diode used in a full color display, there is known a light-emitting diode having three light-emitting elements which emit light in three primary colors R, G and B respectively and which are mounted on one lead frame and sealed with a resin. An example of this related-art polychromatic LED will be described with reference to FIGS. 10A and 10B. FIGS. 10A and 10B are a plan view and a longitudinal sectional view showing the overall configuration of the related-art polychromatic LED.

As shown in FIGS. 10A and 10B, in the polychromatic LED 21, a red light-emitting element 22R, a green light-emitting element 22G and a blue light-emitting element 22B are mounted on a bottom surface of a concave reflecting mirror 23c which is formed on one lead 23a. Other three leads 23R, 23G and 23B extended to the vicinity of the lead 23a are bonded and electrically connected to the red light-emitting element 22R, the green light-emitting element 22G and the blue light-emitting element 22B by three wires 24R, 24G and 24B respectively. The three light-emitting elements 22R, 22G and 22B, the concave reflecting mirror 23c, the three wires 24R, 24G and 24B and part of the leads 23a, 23R, 23G and 23B are sealed with a transparent epoxy resin 25. At the same time, an ellipsoidal convex lens 26 is molded of the transparent epoxy resin 25. The major-diameter-direction length of the polychromatic LED 21 is 7.5 mm. A plurality of this type polychromatic LEDs 21 are arranged at intervals of 10 mm pitch on a substrate to thereby form a full color display.

When such polychromatic LEDs 21 are to be mounted on a surface, however, the influence of heat distortion based on the difference in thermal expansion coefficient between the sealing resin and the metal of the lead portions at a high temperature near 200° C. for surface mounting becomes larger because the length of each polychromatic LED 21 in the direction of the major diameter thereof is large to be 7.5 mm. As a result, the probability that the wires 24R, 24G and 24B will be broken increases, so that the percentage of defective products increases. Moreover, the respective light-emitting elements 22R, 22G and 22B vary in luminous intensity and chromaticity. For example, some green light-emitting elements 22G emit bluish green light or yellowish green light. The yield is lowered as well as much labor is required for selecting light-emitting elements in advance and mounting the selected light-emitting elements, because classification by luminous intensity and classification by chromaticity must be combined with each other. Hence, it is impossible to combine well-matched light-emitting elements 22R, 22G and 22B in order to eliminate such variations in luminous intensity and chromaticity. As a result, display unevenness in color and brightness arises in the full color display. Moreover, because the respective light-emitting elements 22R, 22G and 22B vary in characteristic of luminous intensity distribution, color balance of each color varies in accordance with the viewing direction so that the resulting color may be recognized as a different color. In addition, because three kinds of light-emitting elements emitting light in three colors respectively are provided for one condenser lens, there is a problem that axial displacement occurs in light radiated from the polychromatic LED 21.

Next, a light-emitting diode (hereinafter abbreviated also to "LED") called "reflective LED" is a kind of device. Referring to FIG. 9, an example of the reflective LED will be described. FIG. 9 is a sectional view showing an example of the reflective LED. As shown in FIG. 9, the reflective LED 31 is configured so that a light-emitting element 32 is mounted on a forward end of one 33b of a pair of leads 33a and 33b through which electric power is supplied to the light-emitting element 32. The light-emitting element 32 and the other lead 33a are bonded and electrically connected to each other by a wire 34. The light-emitting element 32, the pair of leads 33a and 33b and the wire 34 are sealed with a transparent epoxy resin 35. At the same time, the transparent epoxy resin 35 forms a reflecting surface shaped like a paraboloid of revolution with the light-emitting element 32 as its focal point so that the reflecting surface is disposed opposite to the light-emitting element 32. Aluminum vapor deposition is applied onto an outside of the reflecting surface so that a concave reflecting mirror 36 is formed on the outside of the reflecting surface.

When light is emitted from the light-emitting element 32, the light is reflected by respective portions of the reflecting mirror 36. The reflected light advances upward in parallel with the center axis of the reflecting surface shaped like a paraboloid of revolution. Then, the light is radiated to the outside from a flat light-radiating surface 37 which is an upper surface of the reflective LED 31. In this manner, the reflective LED 31 is configured so that light emitted from the light-emitting element 32 can be radiated out as light condensed with high efficiency.

The area of the reflecting surface of the reflective LED 31 viewed from the outside is, however, so large that dark noise (pseudo-lighting) due to reflection of external light occurs largely when the reflective LED 31 is turned off. As a result, there arises a problem that contrast between light when the reflective LED 31 is turned on and light when the reflective LED 31 is turned off is low.

SUMMARY OF THE INVENTION

Therefore, an object of the invention is to provide a shielded reflective light-emitting diode which can be mounted on a surface and in which characteristics of luminous intensity distributions of light-emitting elements can be made uniform as well as display unevenness of a display can be reduced.

Further, another object of the invention is to provide a shielded reflective device which is high in external radiation efficiency, high in contrast between light when the device is turned on and light when the device is turned off, and excellent in heat-radiating characteristic; and to provide a light source used for the shielded reflective device.

(1) According to the invention, there is provided a shielded reflective light-emitting diode having: at least one light source including at least one light-emitting element; a reflecting mirror provided opposite to the light source; and a light-shielding member for limiting external light incident on the reflecting mirror, wherein: the light-shielding member has an optical opening portion; and the reflecting mirror is shaped like a cylindrical surface in which light emitted from the light source and reflected by the reflecting mirror is condensed linearly so that the linearly condensed light is radiated out through the optical opening portion of the light-shielding member.

Here, the "optical opening portion" may be a through-hole or a hole filled with a light-transmissive material.

In the shielded reflective LED configured as described above, a small-sized light source having only one light-emitting element is used as the light source. Hence, the light source can be surface-mounted substantially without being influenced by heat distortion based on the difference in thermal expansion coefficient between resin and metal and accordingly with a very low defective rate even in the case where the light-emitting element is sealed with a resin. Moreover, variations in luminous intensity and chromaticity of each of light-emitting elements can be examined when light sources are produced. Hence, when a plurality of light sources are to be mounted in the shielded reflective LED, well-matched light sources can be used in combination after characteristic such as luminous intensity and chromaticity of each light-emitting element is examined. Accordingly, when the LED is applied to a display, display unevenness can be reduced greatly. In addition, when the way of mounting each light source is adjusted finely, variations in characteristics of luminous intensity distributions of the light-emitting elements can be cancelled by one another so that the characteristics of luminous intensity distributions of the light-emitting elements can be made uniform.

In this manner, there can be provided a shielded reflective light-emitting diode which can be surface-mounted and in which characteristics of luminous intensity distributions of light-emitting elements can be made uniform as well as display unevenness of a display can be reduced.

(2) According to the invention, there is provided a shielded reflective light-emitting diode with the configuration defined in (1), wherein the optical opening portion has a size and a shape equivalent to those of an area of light condensed by the reflecting mirror shaped like a cylindrical surface.

In this configuration, the optical opening portion has a size and a shape equivalent to those of an area of light condensed by the cylindrical reflecting mirror. Hence, while the light-shielding member can prevent external light from entering the LED, the efficiency in radiating light to the outside can be maximized.

(3) According to the invention, there is provided a shielded reflective light-emitting diode with the configuration defined in (1) or (2), wherein the light source further includes a concave reflecting mirror provided around the light-emitting element.

In this configuration, light emitted from a light-emitting surface of the light-emitting element is not diffused horizontally but concentrated into an angle range of about 70 degrees with respect to the axis perpendicular to the light-emitting surface. Hence, the reflecting mirror provided opposite to the light source may be disposed suitably if the reflecting mirror can reflect light radiated in the angle range of about 70 degrees with respect to the axis perpendicular to the light-emitting surface. Accordingly, end portions of the reflecting mirror can be disposed so as to be far from the light source. The degree of freedom for designing the reflecting mirror is increased. Moreover, the reflecting mirror is shaped like a cylindrical surface. Hence, light applied to opposite end surfaces of the cylindrical surface is not reflected but absorbed. When the concave reflecting mirror is provided around the light-emitting element, however, light emitted from the light-emitting element can be prevented from being consumed wastefully because the opposite end surfaces of the cylindrical surface are not irradiated with light.

In this manner, there can be provided a shielded reflective light-emitting diode in which light emitted from the light-emitting element can be prevented from being consumed wastefully as well as the degree of freedom for arranging and designing the reflecting mirror can be increased.

(4) According to the invention, there is provided a shielded reflective light-emitting diode with the configuration defined in any one of (1) through (3), wherein the light source further includes a light-transmissive material with which the light-emitting element and the concave reflecting mirror are sealed and which forms a light-radiating surface on a light-emitting surface side of the light-emitting element.

In the shielded reflective LED configured as described above, the light-emitting element is sealed with a light-transmissive material, so that the quantity of light emitted from the light-emitting element is increased to about twice compared with the case where the light-emitting element is not sealed. Hence, the luminous intensity of the light source, and, accordingly, the luminous intensity of the shielded reflective LED are increased greatly. Moreover, because the light-radiating surface is formed on the light-emitting surface side of the light-emitting element, light emitted from the light-emitting element is controlled so that the range of irradiation limited when the concave reflecting mirror is provided around the light-emitting element can be further limited. Hence, the degree of freedom for arranging and designing the reflecting mirror opposite to the light source can be increased more greatly.

In this manner, there can be provided a shielded reflective LED in which the degree of freedom for arranging and designing the reflecting mirror can be increased more greatly as well as luminous intensity can be increased greatly.

(5) According to the invention, there is provided a shielded reflective light-emitting diode with the configuration defined in (4), wherein the light-radiating surface is constituted by a convex lens.

In the shielded reflective LED configured as described above, the convex lens is formed on the light-emitting surface side of the light-emitting element. Hence, light emitted from the light-emitting element can be further condensed so that the range of irradiation can be narrowed more. Hence, end portions of the reflecting mirror provided opposite to the light source can be made farther from the light-emitting surface of the light-emitting element, so that the degree of freedom for designing the reflecting mirror can be further increased.

In this manner, there can be provided a shielded reflective LED in which the range of irradiation with light emitted from the light source can be further narrowed so that the degree of freedom for arranging and designing the reflecting mirror can be further increased.

(6) According to the invention, there is provided a shielded reflective light-emitting diode with the configuration defined in (4) or (5), wherein the light-radiating surface is a curved cylindrical surface shaped so that a top portion of an ellipsoidal convex lens with a major diameter direction facing toward a direction substantially perpendicular to a lengthwise direction of the reflecting mirror shaped like a cylindrical surface is cut in the major diameter direction.

Hence, with respect to the direction of the major diameter of the ellipsoidal convex lens, all light emitted from the light-emitting element is radiated obliquely from the light-radiating surface, so that a portion of the reflecting mirror just under the light source is not irradiated with light. Hence, light radiated through the slit-like optical opening portion contains a large amount of light component advancing in the direction perpendicular to the optical opening portion. When the LED is applied to a display, the spreading angle of light in the vertical direction is narrowed so that light-radiating characteristic favorable to the display can be obtained. On the other hand, with respect to the lengthwise direction of the reflecting mirror, light emitted from the light-emitting element is radiated from the ellipsoidal light-radiating surface. Hence, light is diffused and reflected by the reflecting mirror, so that the reflected light is radiated all over the full length of the optical opening portion. Hence, when the LED is applied to a display, the spreading angle of light in the horizontal direction is widened so that light-radiating characteristic favorable to the display can be obtained.

In this manner, there can be provided a shielded reflective light-emitting diode in which preferred light-radiating characteristic both in the vertical direction and in the horizontal direction can be obtained when the LED is applied to a display.

(7) According to the invention, there is provided a shielded reflective light-emitting diode with the configuration defined in any one of (1) through (6), wherein a plurality of light sources which are arranged along an axial direction of the reflecting mirror shaped like a cylindrical surface are used as the at least one light source.

Because the plurality of light sources are arranged along the axial direction of the cylindrical reflecting mirror, there is no axial displacement among the plurality of light sources.

In this manner, there can be provided a shielded reflective light-emitting diode in which a plurality of light sources can be mounted without causing any axial displacement.

(8) According to the invention, there is provided a shielded reflective light-emitting diode with the configuration defined in any one of (1) through (7), wherein a plurality of light sources which emit light in different colors respectively are used as the at least one light source.

In the shielded reflective LED configured as described above, a plurality of light sources for emitting light in a plurality of colors respectively are provided. Hence, the plurality of colors are mixed with one another, so that the light in the mixed color is radiated out. In this case, there is however a fear that color irregularity may occur because of the axial displacement and the difference in characteristic of luminous intensity distribution of the LED. When the plurality of light sources are arranged along the axial direction of the cylindrical reflecting mirror, the axial displacement can be prevented. Moreover, when the way of mounting each light source is adjusted finely, variations in characteristics of luminous intensity distributions of light-emitting elements can be cancelled with one another so that the characteristic of luminous intensity distribution of the LED can be made uniform. Hence, there is no color irregularity.

In this manner, there can be provided a shielded reflective light-emitting diode which has a plurality of light sources different in color and in which both axial displacement and color irregularity can be prevented.

(9) According to the invention, there is provided a shielded reflective light-emitting diode with the configuration defined in any one of (1) through (8), wherein a red light source having a red light-emitting element, a green light source having a green light-emitting element and a blue light source having a blue light-emitting element are used as the at least one light source.

In the shielded reflective LED configured as described above, three light sources for emitting light in three primary colors respectively are provided. Hence, when electric power supplied to each of the light sources is changed, the resulting LED can be provided as a shielded reflective LED capable of emitting light in any color. When a plurality of such LEDs are disposed on a substrate, a full color display can be formed. Moreover, each of the light sources is a small-sized light source having only one light-emitting element. Hence, even in the case where the light-emitting element is sealed with a resin, the light source can be surface-mounted substantially without being influenced by heat distortion based on the difference in thermal expansion coefficient between resin and metal and with a very low defective rate. When light sources are produced in a state in which a light-emitting element in each of the light sources is sealed with a resin, variations in luminous intensity and chromaticity of each of the light-emitting elements used in the light sources can be easily examined and selected before the light sources are mounted. Hence, it is practically possible to mount well-matched light sources in combination after examination of the characteristics such as luminous intensity and chromaticity of three-color light-emitting elements. Display unevenness of a full color display can be reduced greatly. Moreover, when the way of mounting each of the light sources is adjusted finely, variations in characteristics of luminous intensity distributions of the light-emitting elements can be cancelled with one another so that the characteristic of luminous intensity distribution of the LED can be made uniform.

In this manner, there can be provided a shielded reflective light-emitting diode which can be used for forming a full color display and can be surface-mounted and in which characteristics of luminous intensity distributions of light-emitting elements can be made uniform as well as display unevenness of the display can be reduced.

(10) Still further, according to the invention, there is provided a shielded reflective device having: a light source portion including a light-emitting portion; a reflecting mirror provided opposite to a light-radiating side of the light source portion; and a douser (light-shielding member) including an optical opening portion, wherein: the shielded reflective device further has a substrate portion on which the light source portion is mounted; and a side of the substrate portion on which the light source portion is mounted is black.

Here, the "optical opening portion" means an opening portion through which light can pass. The optical opening portion may be a through-hole or a hole filled with a light-transmissive material.

The shielded reflective device having this configuration further has a substrate portion on which the light source portion is mounted. A side of the substrate portion on which the light source portion is mounted is black. Hence, even in the case where external light enters the device through the optical opening portion when the device is turned off, the external light is reflected toward the light source portion-mounting side of the substrate portion by the reflecting mirror and absorbed to the substrate portion. That is, the external light never returns to the outside. Hence, pseudo-lighting is prevented thoroughly, so that contrast between light when the device is turned on and light when the device is turned off can be made high.

In this manner, there can be provided a shielded reflective device which is high in external radiation efficiency and high in contrast between light when the device is turned on and light when the device is turned off.

(11) According to the invention, there is provided a shielded reflective device with the configuration defined in (10), further having a spacer which is provided for changing a height of the substrate portion and which is black.

Hence, the provision of the spacer makes the focal length long. There can be provided a shielded reflective device which has characteristic of luminous intensity distribution with a high degree of light condensation.

(12) According to the invention, there is provided a shielded reflective device having: a light source portion including a light-emitting portion; a reflecting mirror provided opposite to a light-radiating side of the light source portion; and a douser including an optical opening portion, wherein the douser is shaped like a film.

Strictly, because the light-emitting portion contained in the light source portion has a certain size, the condensed light has a certain degree of width in the vicinity of the focal point. For this reason, when the douser is a thick plate, external radiation efficiency cannot be made high if the width of the optical opening portion is not large. However, when the douser is shaped like a thin film, high external radiation efficiency can be obtained even in the case where the width of the optical opening portion is small. Accordingly, the width of the optical opening portion can be narrowed. As a result, entrance of external light can be suppressed to be minimized, so that contrast between light when the device is turned on and light when the device is turned off can be made high.

(13) According to the invention, there is provided a light source having: a light-emitting element; a light-transmissive material with which the light-emitting element is sealed; and a substrate, wherein: a portion of the substrate on which the light-emitting element is mounted is made of a heat-dissipation conductive member; and the heat-dissipation conductive member reaches a rear surface of the substrate.

As described above, the light-emitting element is mounted on the heat-dissipation conductive member of the substrate and the heat-dissipation conductive member reaches the rear surface of the substrate. Hence, heat generated from the light-emitting element is transmitted to the rear side of the substrate through the heat-dissipation conductive member. Hence, heat generated from the light-emitting element can be radiated well.

(14) According to the invention, there is provided a light source with the configuration defined in (13), wherein the light-transmissive material forms a convex lens.

Hence, light emitted from the light-emitting element is made incident on an interface of the light-transmissive material at an incident angle approximately perpendicular to the interface on the basis of the convex lens. Hence, when the light source is used as a light source for a shielded reflective device, light condensation property is improved so that external radiation efficiency is made high.

(15) According to the invention, there is provided a light source with the configuration defined in (13) or (14), wherein the substrate is shaped so that four corners of the substrate are cut.

As described above, the four corners of the substrate are cut. Hence, when the light source is used in a shielded reflective device, light reflected by the reflecting mirror is not blocked by the four corners and can be radiated out so as to be used effectively.

(16) According to the invention, there is provided a light source with the configuration defined in (14), wherein (width of the substrate−diameter of the convex lens) $\leq 1$ mm.

The substrate type light source is superior to the lead type light source in that the width of the substrate can be reduced by the width of a protruded portion of the lead from side surfaces. Therefore, when the width of the protruded portion of the substrate from the diameter of the convex lens is suppressed to be not larger than 1 mm, the total size of the light source can be reduced.

(17) According to the invention, there is provided a shielded reflective device using a light source defined in (16).

The light source as in (16) is configured so that the width of the protruded portion of the substrate from the diameter of the convex lens is suppressed to be not larger than 1 mm to thereby reduce the total size of the light source. When the light source is used in a shielded reflective device, the light source can be made to be approximated to a point source as well as space saving can be attained. Hence, external radiation efficiency can be made higher.

(18) According to the invention, there is provided a shielded reflective device having a substrate portion on which a light source portion is mounted, wherein: a portion of the substrate portion on which the light source portion is mounted is made of a heat-dissipation conductive member; and the heat-dissipation conductive member reaches a rear surface of the substrate portion.

As described above, the light source portion is mounted on the heat-dissipation conductive member of the substrate portion. The heat-dissipation conductive member reaches the rear surface of the substrate portion. Hence, heat generated from the light source portion is transmitted to the rear surface of the substrate portion through the heat-dissipation conductive member. Hence, heat generated from the light source portion can be radiated well.

The aforementioned all characteristics (1) to (18) can be combined into the possible extent to put the device or diode into practical use.

Features and advantages of the invention will be evident from the following detailed description of the preferred embodiments described in conjunction with the attached drawings.

DETAILED DESCRIPTION OF THE PREFERRED EMBODIMENTS

Embodiments of the invention will be described below with reference to the drawings.

Embodiment 1

Figure 1A:
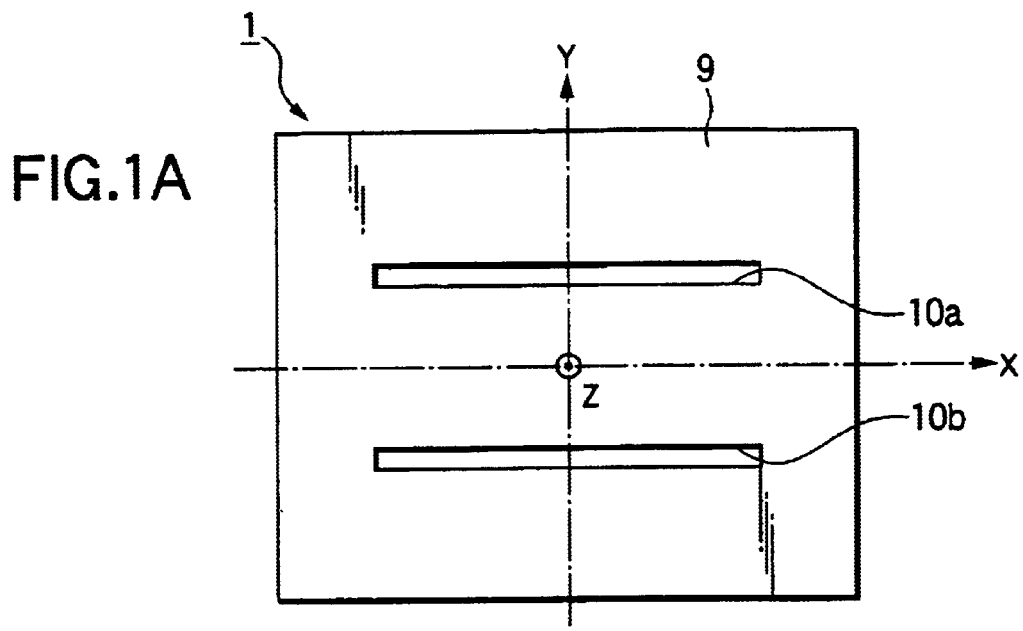
FIG. 1A is a plan view showing the configuration of a shielded reflective light-emitting diode according to Embodiment 1 of the invention.
Figure 1B:
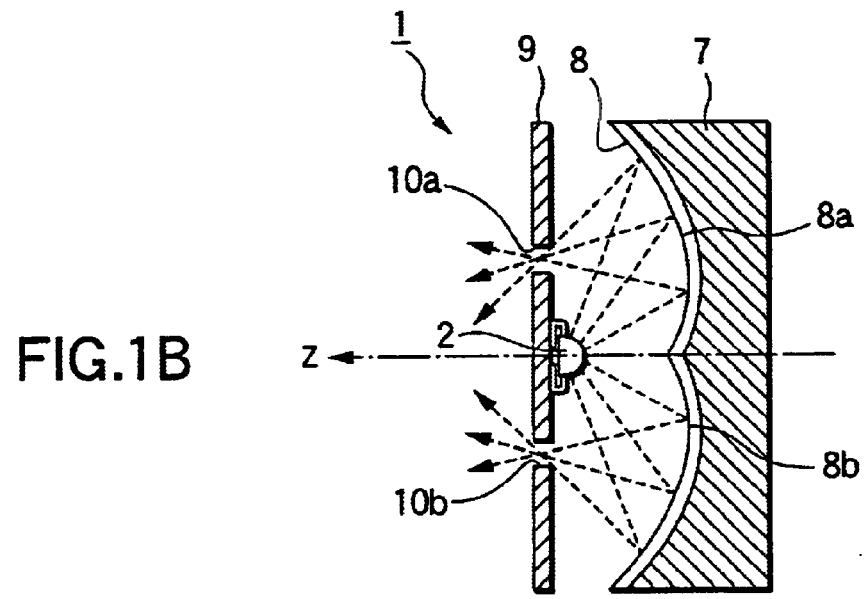
FIG. 1B is a longitudinal sectional view taken along the Y direction in FIG. 1A.
Figure 1C:
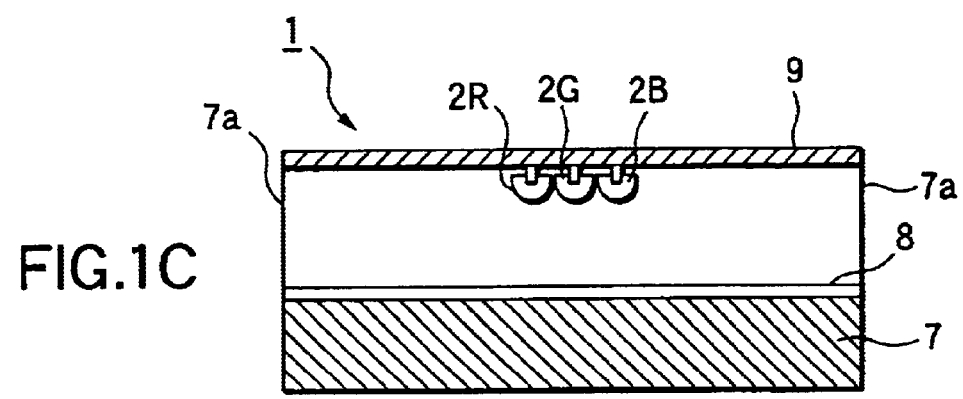
FIG. 1C is a longitudinal sectional view taken along the X direction in FIG. 1A.
Figure 2A:
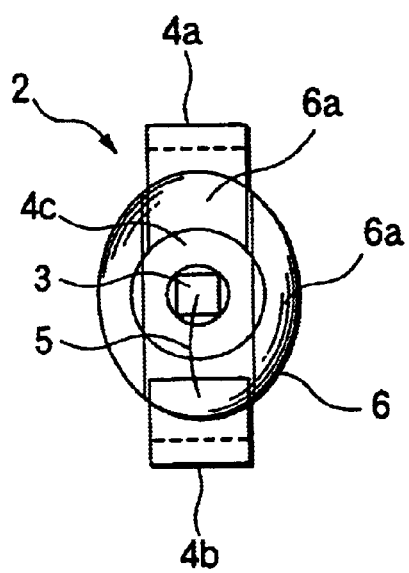
FIG. 2A is a plan view showing the configuration of a light source used in the shielded reflective light-emitting diode according to Embodiment 1 of the invention.
Figure 2B:
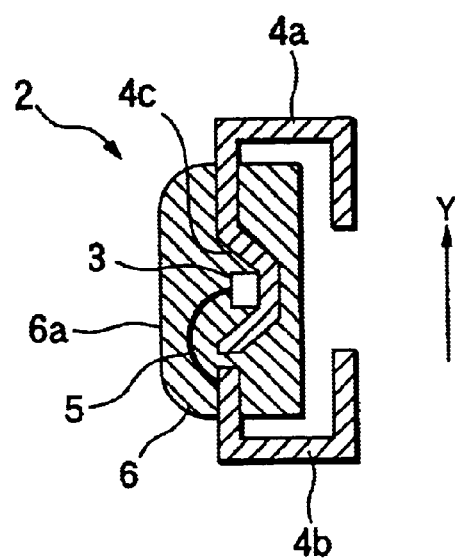
FIG. 2B is a longitudinal sectional view taken along the Y direction.
Figure 2C:
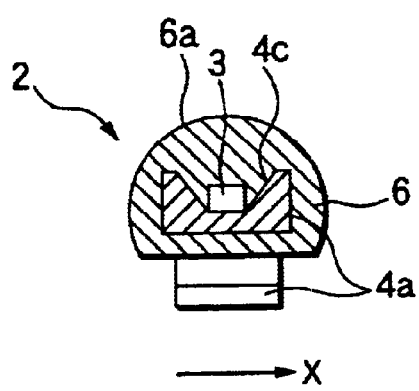
FIG. 2C is a longitudinal sectional view taken along the X direction.

Referring first to FIGS. 1A to 1C and FIGS. 2A to 2C, Embodiment 1 of the invention will be described. FIG. 1A is a plan view showing the configuration of a shielded reflective light-emitting diode according to Embodiment 1 of the invention. FIG. 1B is a longitudinal sectional view taken along the Y direction in FIG. 1A. FIG. 1C is a longitudinal sectional view taken along the X direction in FIG. 1A. FIG. 2A is a plan view showing the configuration of a light source used in the shielded reflective light-emitting diode according to Embodiment 1 of the invention. FIG. 2B is a longitudinal sectional view taken along the Y direction. FIG. 2C is a longitudinal sectional view taken along the X direction.

As shown in FIG. 1A, in the shielded reflective LED 1 according to Embodiment 1, two slit-like optical opening portions 10a and 10b extended in the X direction are formed in a light-shielding member 9 which serves also as a mount substrate. LED light is radiated out through these optical opening portions 10a and 10b.

As shown in FIG. 1B, a light source 2 having a light-emitting element is mounted on a rear surface of the light-shielding member 9 and between the optical opening portions 10a and 10b. As will be described later, the light source 2 is so small-sized that only one light-emitting element is sealed with a resin. Hence, the light source 2 can be surface-mounted with a very low defective rate and substantially without being influenced by heat distortion based on the difference in thermal expansion coefficient between resin and metal even at a high temperature near 200° C. required for surface mounting.

A reflecting substrate 7 is disposed in a position opposite to the light source 2 and far from the light-shielding member 9. The reflecting substrate 7 has a concave surface of a polycarbonate resin, and a reflecting mirror 8 formed on the concave surface by aluminum vapor deposition. A reflecting surface 8a of the reflecting mirror 8 is formed as a cylindrical surface in which a part of an ellipse with the light source 2 and the optical opening portion 10a as its two focal points is extended in the lengthwise direction of the optical opening portion 10a (X direction in FIG. 1A). On the other hand, a reflecting surface 8b of the reflecting mirror 8 is formed as a cylindrical surface in which a part of an ellipse with the light source 2 and the optical opening portion 10b as its two focal points is extended in the lengthwise direction of the optical opening portion 10b. Hence, all light emitted from the light source 2 and reflected by the reflecting surface 8a is condensed into the optical opening portion 10a and then radiated out through the optical opening portion 10a. Further, all light emitted from the light source 2 and reflected by the reflecting surface 8b is condensed into the optical opening portion 10b and then radiated out through the optical opening portion 10b.

As shown in FIG. 1C, in the shielded reflective LED 1 according to Embodiment 1, three light sources 2R, 2G and 2B are mounted on the rear surface of the light-shielding member 9 so as to be arranged side by side in the X direction. That is, a red light source 2R, a green light source 2G and a blue light source 2B for emitting light in three primary colors respectively are mounted densely in the X-direction center. Hence, when electric power supplied to each of the light sources 2R, 2G and 2B is controlled, light in any color can be radiated from the shielded reflective LED 1. That is, the shielded reflective LED 1 can be applied to a full color display.

In each of the three-color light sources 2R, 2G and 2B, a light-emitting element is sealed with a resin. Hence, variations in luminous intensity and chromaticity of light-emitting elements used for each of the three-color light sources 2R, 2G and 2B can be easily examined and selected before mounting. Hence, it is practically possible to mount well-matched three-color light sources 2R, 2G and 2B in combination, so that display unevenness of a full color display can be reduced greatly. Moreover, because the reflecting mirror 8 has cylindrical surfaces in which a part of an ellipse with the light source 2 and the optical opening portion 10a or 10b as its two focal points is extended in the lengthwise direction of the optical opening portion 10a or 10b, there is no axial displacement when such a plurality of light sources 2R, 2G and 2B are arranged along the lengthwise direction.

Referring next to FIGS. 2A to 2C, the configuration of the light source 2 used in the shielded reflective LED 1 according to Embodiment 1 will be described. As shown in FIGS. 2A and 2B, the light source 2 has a light-emitting element 3, a pair of leads 4a and 4b through which electric power is supplied to the light-emitting element 3, and a concave reflecting mirror 4c formed at a forward end of one 4a of the leads. The light-emitting element 3 is mounted on a bottom surface of the reflecting mirror 4c by silver paste. After the light-emitting element 3 is bonded and electrically connected to the other lead 4b by a wire 5, the light-emitting element 3, the reflecting mirror 4c, the wire 5 and part of the pair of leads 4a and 4b are sealed with a transparent epoxy resin 6 which serves as a light-transmissive material. At the same time, a light-radiating surface 6a is formed on the light-emitting surface side of the light-emitting element 3. Then, portions of the leads 4a and 4b protruded from the transparent epoxy resin 6 are bent substantially perpendicularly along the side surfaces of the transparent epoxy resin 6 and further bent substantially perpendicularly along the rear surface of the transparent epoxy resin 6. Thus, the light source 2 is provided as a light source which can be surface-mounted.

In the light source 2 configured as described above, the concave reflecting mirror 4c is provided around the light-emitting element 3. Hence, light emitted horizontally from the light-emitting surface of the light-emitting element 3 is also reflected by the concave reflecting mirror 4c, so that light can be radiated from the light-emitting element 3 while concentrated into an angle range of about 70 degrees with respect to the axis perpendicular to the light-emitting surface of the light-emitting element 3. Hence, the necessity that an end surface of the reflecting mirror 8 must reach a position tangent to the light-shielding member 9 as shown in FIG. 1B is eliminated. That is, the reflecting mirror 8 can be disposed so as to be far from the light source 2 and from the light-shielding member 9. Light applied to opposite end surfaces 7a of the cylindrical reflecting mirror 8 shown in FIG. 1C may be absorbed without being reflected. In the shielded reflective LED 1 according to Embodiment 1, however, the range of light applied to the concave reflecting mirror 4c is narrowed to an angle range of about 70 degrees with respect to the axis perpendicular to the light-emitting surface. Hence, light can be prevented from being applied to the opposite end surfaces 7a. That is, light emitted from the light-emitting element 3 can be prevented from being consumed wastefully. Besides the cylindrical reflecting mirror 8, reflecting mirrors may be disposed on the opposite end surfaces 7a perpendicular to the cylindrical surface.

As shown in FIG. 2A, the light-radiating surface 6a of the light source 2 is shaped so that a top portion of an ellipsoidal convex lens is cut in the direction of the major diameter of the ellipsoid by a curved cylindrical surface. As a result, the Y-direction component of light emitted from the light-emitting element 3 and radiated from the light-radiating surface 6a is refracted obliquely. Hence, as shown in FIG. 1B, a portion of the reflecting mirror 8 just under the light source 2 is little irradiated with light. That is, light radiated out through the slit-like optical opening portions 10a and 10b has a large amount of Z-direction component. Hence, when the LED is applied to a display, the spreading angle of light in the vertical direction (Y direction) is narrowed so that light-radiating characteristic favorable to the display can be obtained. On the other hand, the X-direction component of light is spread and reflected by the reflecting mirror 8 because light emitted from the light-emitting element 3 is radiated from the light-radiating surface 6a which is an elliptic surface. As a result, the reflected light is radiated all over the slit length of the optical opening portions 10a and 10b. Hence, when the LED is applied to a display, the spreading angle of light in the horizontal direction (X direction) is widened so that light-radiating characteristic favorable to the display can be obtained.

Further, a large part of external light incident on the LED is absorbed to the light-shielding member 9. A very small part of the external light entering the LED through the optical opening portions 10a and 10b is reflected by the reflecting mirror 8 and then most of the light is absorbed. Hence, the amount of the external reflected light is slight. Hence, light emitted from the light-emitting element 3 can be radiated out effectively when the light source 2 is turned on. On the other hand, when the light source 2 is turned off, the problem of pseudo-lighting or dark noise which makes the LED whitish as a whole does not arise. The LED can be provided as a shielded reflective LED which is high in contrast between light at the time of turning-on and light at the time of turning-off.

Embodiment 2

Figure 3A:
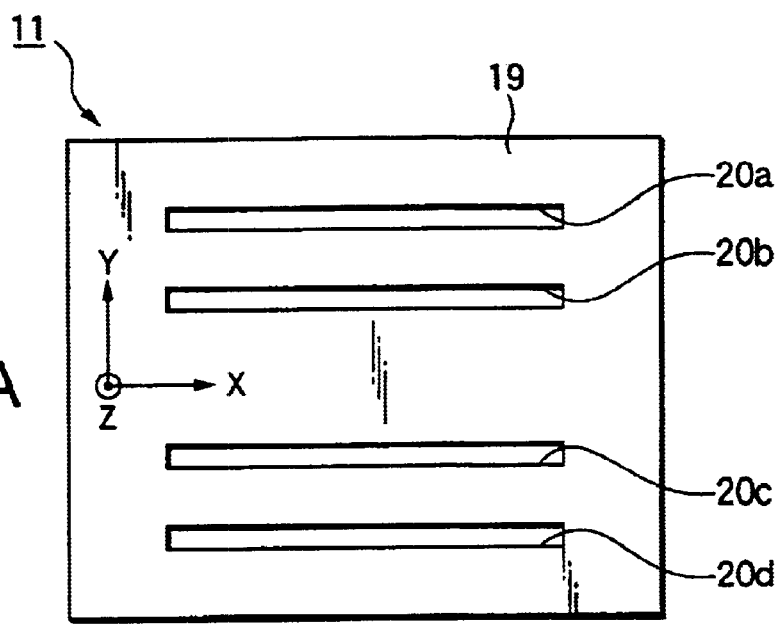
FIG. 3A is a plan view showing the configuration of a shielded reflective light-emitting diode according to Embodiment 2 of the invention.
Figure 3B:
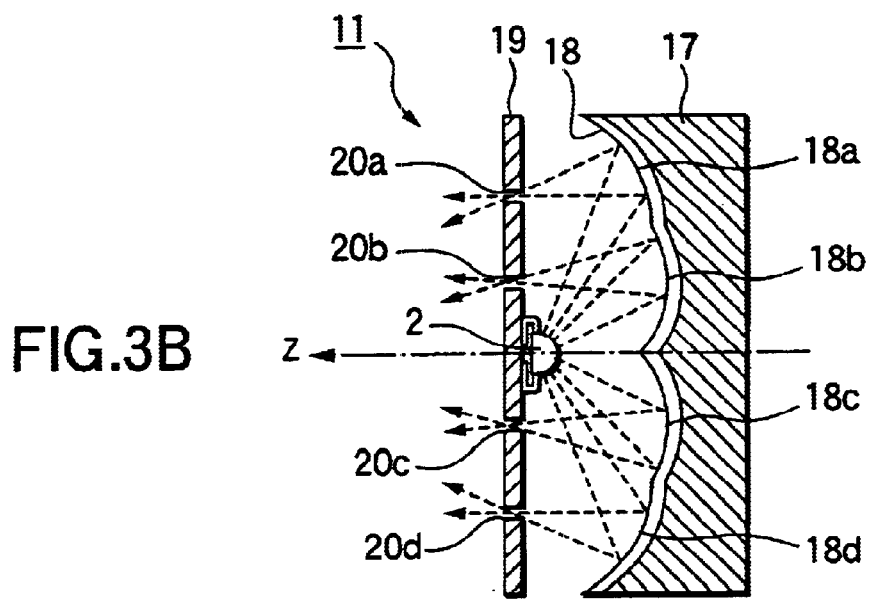
FIG. 3B is a longitudinal sectional view taken along the Y direction in FIG. 3A.
Figure 3C:
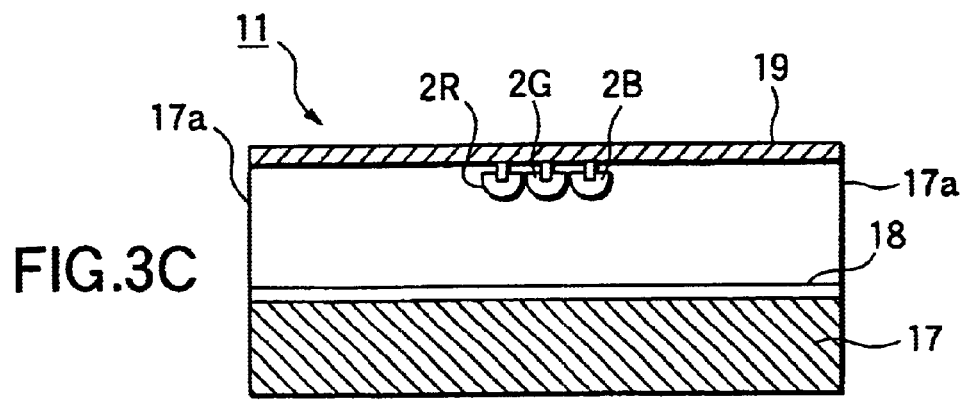
FIG. 3C is a longitudinal sectional view taken along the X direction in FIG. 3A.

Referring to FIGS. 3A to 3C, Embodiment 2 of the invention will be described below. FIG. 3A is a plan view showing the configuration of a shielded reflective light-emitting diode according to Embodiment 2 of the invention. FIG. 3B is a longitudinal sectional view taken along the Y direction in FIG. 3A. FIG. 3C is a longitudinal sectional view taken along the X direction in FIG. 3A.

As shown in FIG. 3A, in the shielded reflective LED 1 according to Embodiment 2, four slit-like optical opening portions 20a, 20b, 20c and 20d extended in the X direction are formed in a light-shielding member 19 which serves also as a mount substrate. LED light is radiated out through these optical opening portions 20a, 20b, 20c and 20d.

As shown in FIG. 3B, a light source 2 having a light-emitting element is mounted on a rear surface of the light-shielding member 19 and between the optical opening portions 20b and 20c. The configuration of the light source 2 is the same as that in Embodiment 1. The light source 2 is so small-sized that only one light-emitting element 3 is sealed with a transparent epoxy resin 6. Hence, the light source 2 can be surface-mounted with a very low defective rate and substantially without being influenced by heat distortion based on the difference in thermal expansion coefficient between resin and metal even at a high temperature near 200° C. required for surface mounting.

A reflecting substrate 17 is disposed in a position opposite to the light source 2 and far from the light-shielding member 19. The reflecting substrate 17 has a concave surface of a polycarbonate resin, and a reflecting mirror 18 formed on the concave surface by aluminum vapor deposition. A reflecting surface 18a of the reflecting mirror 18 is formed as a cylindrical surface in which a part of an ellipse with the light source 2 and the optical opening portion 20a as its two focal points is extended in the lengthwise direction of the optical opening portion 20a (X direction in FIG. 3A). Similarly, a reflecting surface 18b of the reflecting mirror 18 is formed as a cylindrical surface in which a part of an ellipse with the light source 2 and the optical opening portion 20b as its two focal points is extended in the lengthwise direction of the optical opening portion 20b. Similarly, a reflecting surface 18c of the reflecting mirror 18 is formed as a cylindrical surface in which a part of an ellipse with the light source 2 and the optical opening portion 20c as its two focal points is extended in the lengthwise direction of the optical opening portion 20c. Similarly, a reflecting surface 18d of the reflecting mirror 18 is formed as a cylindrical surface in which a part of an ellipse with the light source 2 and the optical opening portion 20d as its two focal points is extended in the lengthwise direction of the optical opening portion 20d.

Hence, all light emitted from the light source 2 and reflected by the reflecting surface 18a is condensed into the optical opening portion 20a and then radiated out through the optical opening portion 20a. Similarly, all light emitted from the light source 2 and reflected by the reflecting surface 18b is condensed into the optical opening portion 20b and then radiated out through the optical opening portion 20b. Similarly, all light emitted from the light source 2 and reflected by the reflecting surface 18c is condensed into the optical opening portion 20c and then radiated out through the optical opening portion 20c. Similarly, all light emitted from the light source 2 and reflected by the reflecting surface 18d is condensed into the optical opening portion 20d and then radiated out through the optical opening portion 20d.

Like Embodiment 1, the light-radiating surface 6a of the light source 2 in this embodiment is shaped so that a top portion of an ellipsoidal convex lens is cut in the direction of the major diameter of the ellipsoid by a curved cylindrical surface. As a result, the Y-direction component of light emitted from the light-emitting element 3 and radiated from the light-radiating surface 6a is refracted obliquely. Hence, as shown in FIG. 3B, a portion of the reflecting mirror 18 just under the light source 2 is little irradiated with light. That is, light radiated out through the slit-like optical opening portions 20*a*, 20*b*, 20*c* and 20*d* has a large amount of Z-direction component. Hence, when the LED is applied to a display, the spreading angle of light in the vertical direction (Y direction) is narrowed so that light-radiating characteristic favorable to the display can be obtained.

On the other hand, the X-direction component of light is spread and reflected by the reflecting mirror 18 because light emitted from the light-emitting element 3 is radiated from the light-radiating surface 6*a* which is an elliptic surface, as described above for Embodiment 1. As a result, the reflected light is radiated all over the slit length of the optical opening portions 20*a*, 20*b*, 20*c* and 20*d*. Hence, when the LED is applied to a display, the spreading angle of light in the horizontal direction (X direction) is widened so that light-radiating characteristic favorable to the display can be obtained.

Further, a large part of external light incident on the LED is absorbed to the light-shielding member 9. A very small part of the external light entering the LED through the optical opening portions 20*a*, 20*b*, 20*c* and 20*d* is reflected by the reflecting mirror 18 and then most of the light is absorbed. Hence, the amount of the external reflected light is slight. Hence, light emitted from the light-emitting element 3 can be radiated out effectively when the light source 2 is turned on. On the other hand, when the light source 2 is turned off, the problem of pseudo-lighting or dark noise which makes the LED whitish as a whole does not arise. The LED can be provided as a shielded reflective LED which is high in contrast between light at the time of turning-on and light at the time of turning-off.

As shown in FIG. 3C, in the shielded reflective LED 11 according to Embodiment 2, three light sources 2R, 2G and 2B are mounted on the rear surface of the light-shielding member 19 so as to be arranged side by side in the X direction in the same manner as in Embodiment 1. That is, a red light source 2R, a green light source 2G and a blue light source 2B for emitting light in three primary colors respectively are mounted densely in the X-direction center. Hence, when electric power supplied to each of the light sources 2R, 2G and 2B is controlled, light in any color can be radiated from the shielded reflective LED 11. That is, the shielded reflective LED 11 can be applied to a full color display.

In each of the three-color light sources 2R, 2G and 2B, a light-emitting element is sealed with a resin. Hence, variations in luminous intensity and chromaticity of light-emitting elements used for each of the three-color light sources 2R, 2G and 2B can be easily examined and selected before mounting. Hence, it is practically possible to mount well-matched three-color light sources 2R, 2G and 2B in combination, so that display unevenness of a full color display can be reduced greatly. Moreover, because the reflecting mirror 18 has cylindrical surfaces in which a part of an ellipse with the light source 2 and each of the optical opening portions 20*a*, 20*b*, 20*c* and 20*d* as its two focal points is extended in the lengthwise direction of the optical opening portion, there is no axial displacement when such a plurality of light sources 2R, 2G and 2B are arranged along the lengthwise direction.

Light applied to opposite end surfaces 17*a* of the cylindrical reflecting mirror 18 shown in FIG. 3C may be absorbed without being reflected. Also in the light source 2 of the shielded reflective LED 11 according to Embodiment 2, the range of light applied to the concave reflecting mirror 4*c* is narrowed to an angle range of about 70 degrees with respect to the axis perpendicular to the light-emitting surface. Hence, light can be prevented from being applied to the opposite end surfaces 17*a*. That is, light emitted from the light-emitting element 3 can be prevented from being consumed wastefully. Besides the cylindrical reflecting mirror 18, reflecting mirrors may be disposed on the opposite end surfaces 17*a* perpendicular to the cylindrical surface.

Although the respective embodiments have been described upon the case where the light-emitting element 3, the concave reflecting mirror 4C, etc. in the light source 2 are sealed with the transparent epoxy resin 6 which serves as a light-transmissive material, the invention may be applied also to the case where they are not sealed with such a resin. Although the respective embodiments have been described upon the case where the light-radiating surface 6*a* formed by the transparent epoxy resin 6 is shaped so that a top portion of an ellipsoidal convex lens is cut in the direction of the major diameter of the ellipsoid by a curved cylindrical surface, the invention maybe applied also to the case where the light-radiating surface is shaped variously, such as like a flat surface, a semi-spherical surface with the light-emitting element as its origin, or an elliptic surface.

Although the respective embodiments have been described upon the case where the concave reflecting mirror 4*c* is provided around the light-emitting element 3 in the light source 2, the invention may be applied also to the case where the concave reflecting mirror 4*c* is not provided.

Although the respective embodiments have been described upon the case where the transparent epoxy resin 6 is used as a light-transmissive material which serves as a sealing material, any light-transmissive material such as a transparent silicone resin may be used if conditions such as fluidity and filling characteristic before curing and transparency and strength after curing can be satisfied.

Although the respective embodiments have been described upon the case where each of the optical opening portions 10*a*, 10*b*, 20*a*, 20*b*, 20*c* and 20*d* is shaped like a slit, the optical opening portion need not be shaped like a slit, that is, any shape may be used if the shape is formed so that light condensed by the reflecting mirror can be transmitted through the optical opening portion.

Although the respective embodiments have been described upon the case where each of the optical opening portions 10*a*, 10*b*, 20*a*, 20*b*, 20*c* and 20*d* is formed as a through-hole, the invention may be applied also to the case where the optical opening portion is formed as a hole filled with a light-transmissive material such as transparent epoxy resin or glass. Although the respective embodiments have been described upon the case where two or four slit-like optical opening portions are provided, the number of slit-like opening portions is not limited thereto, that is, one slit-like opening portion may be provided or three slit-like opening portions may be provided.

Although the respective embodiments have been described upon the case where a mount substrate for surface-mounting the light source 2 is provided with slit-like optical opening portions and serves as a light-shielding member, the invention may be applied also to the case where a light-shielding member is provided separately from a mount substrate in the condition that holes larger than the optical opening portions are formed in the mount substrate.

Although the respective embodiments have been described upon the case where the red light source 2R, the green light source 2G and the blue light source 2B for emitting light in three primary colors respectively are mounted as light sources 2, the colors of light emitted from the light sources are not limited to these three colors and the light sources need not emit light in such a plurality of colors.

The number of light sources is not limited, that is, one light source may be provided.

The other configuration of the shielded reflective light-emitting diode as to the shape, the number of parts, the material, the size and the connecting relation thereof is not limited to the embodiments.

Embodiment 3

Figure 4:
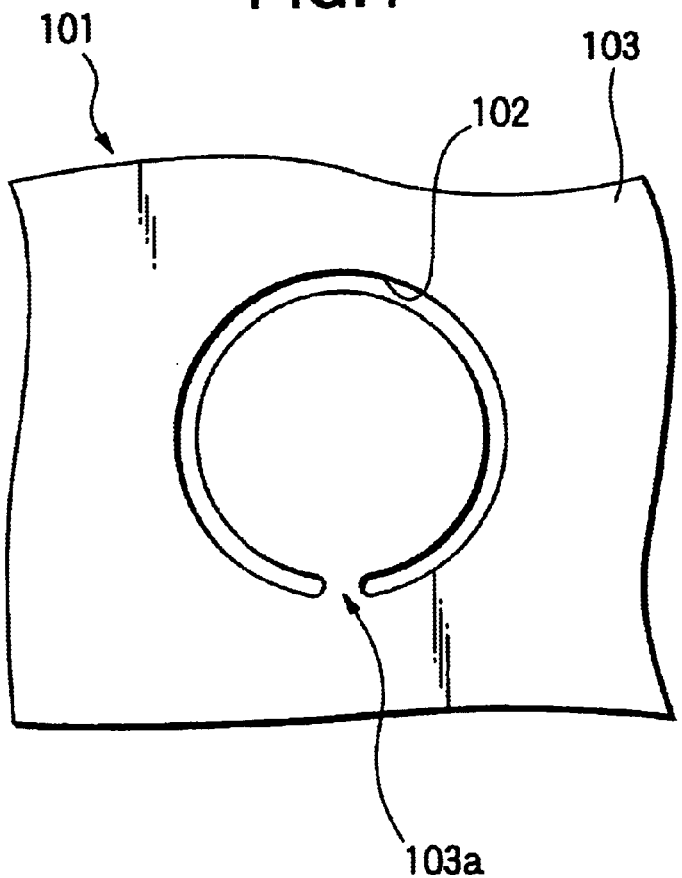
FIG. 4 is a front view showing the periphery of an optical opening portion in a shielded reflective device according to Embodiment 3 of the invention.
Figure 5:
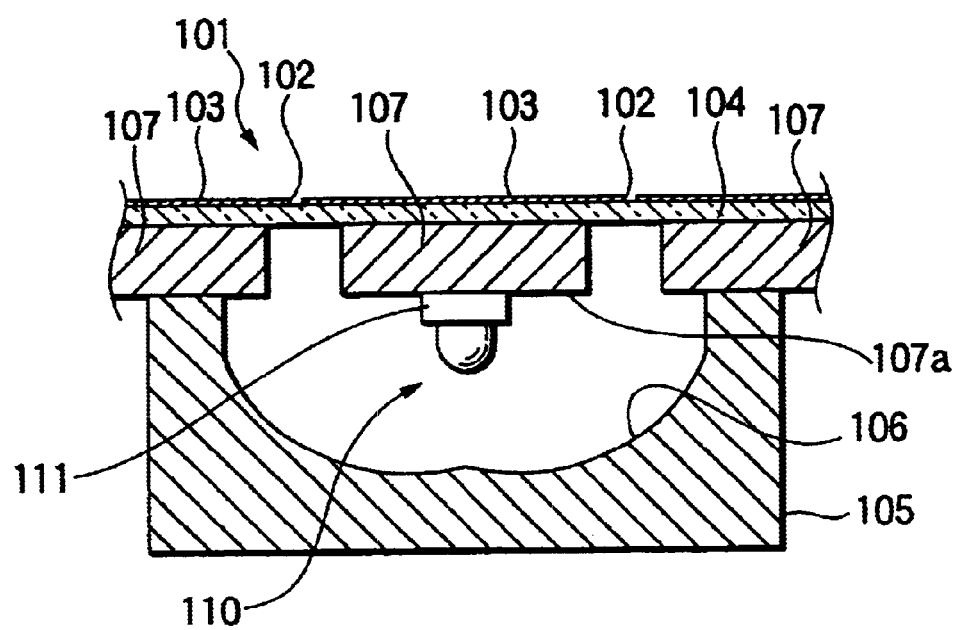
FIG. 5 is a longitudinal sectional view showing the shielded reflective device according to Embodiment 3 of the invention.
Figure 6:
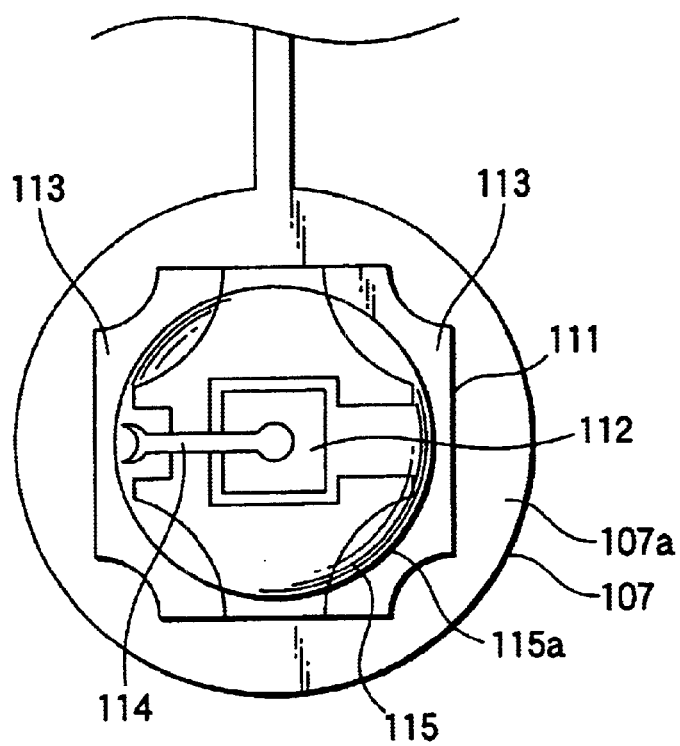
FIG. 6 is a plan view showing the overall configuration of a light source according to Embodiment 3 of the invention.
Figure 7:
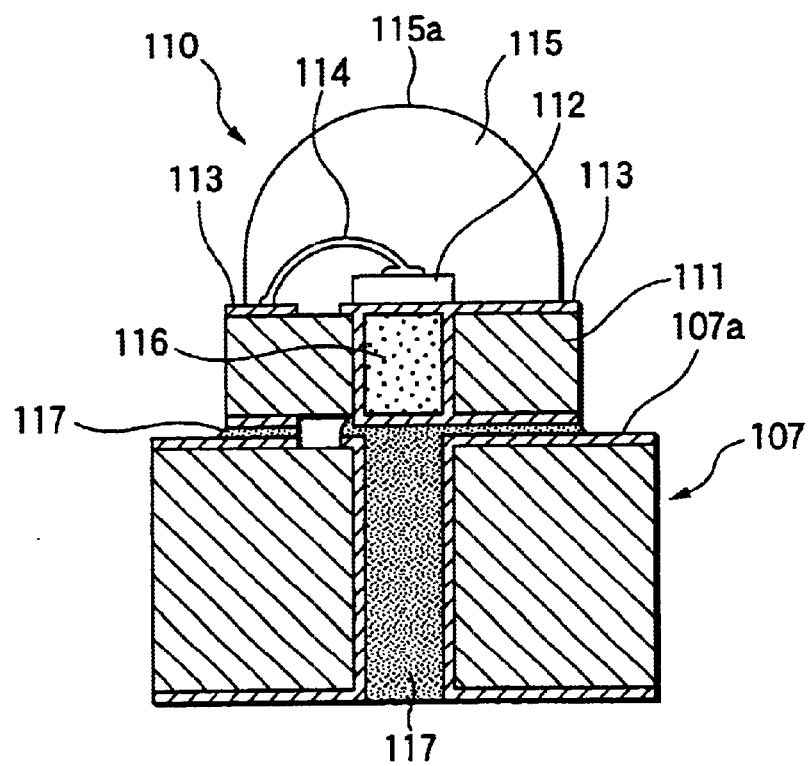
FIG. 7 is a longitudinal sectional view showing the overall configuration of the light source according to Embodiment 3 of the invention.

Referring to FIGS. 4 through 7, a shielded reflective device (shielded reflective light-emitting diode) and a light source according to Embodiment 3 of the invention will be first described. FIG. 4 is a front view showing the periphery of an optical opening portion in the shielded reflective device according to Embodiment 3 of the invention. FIG. 4 is a longitudinal sectional view showing the shielded reflective device according to Embodiment 3 of the invention. FIG. 5 is a plan view showing the overall configuration of the light source according to Embodiment 3 of the invention. FIG. 7 is a longitudinal sectional view showing the overall configuration of the light source according to Embodiment 1 of the invention.

As shown in FIG. 4, a shielded reflective LED 1 which is the shielded reflective device according to Embodiment 3 of the invention has an optical opening portion 102 which is substantially circularly shaped and very narrow. Even in the case where the optical opening portion 102 is narrow as described above, high external radiation efficiency can be obtained. This is because the optical opening portion 102 is provided in a 0.1 mm-thick black PET film (douser) 103. The black PET film 103 has front and rear surfaces which are sandblasted so as to be matted.

As shown in FIG. 5, the light source 110 of the shielded reflective LED 101 is a lens type LED having a light-emitting element sealed with a transparent epoxy resin. A concave reflecting surface, which is formed so that a part of an ellipsoid with the light source 110 and the optical opening portion 102 as its two focal points is rotated around the center axis of the light source 110, is formed on a reflecting substrate 105 which is injection-molded of an acrylic resin. Aluminum vapor deposition is applied onto the reflecting surface to thereby form a reflecting mirror 106. Hence, all light emitted from the light source 110 and reflected by the reflecting mirror 106 is radiated out through the optical opening portion 102. Strictly, because the light-emitting element included in the light source 110 has a certain size, the condensed light has a certain degree of width in the vicinity of the focal point. Hence, when the douser (light-shielding member) 103 is a thick plate, external radiation efficiency cannot be made high if the width of the optical opening portion 102 is not large. In Embodiment 3, however, high external radiation efficiency can be obtained even in the case where the width of the optical opening portion 102 is narrow, because the douser 103 is a 0.1 mm-thick film.

The douser 103 is stuck onto a 0.6 mm-thick transparent glass plate 104. A substrate portion 107 made of a double-side through-hole glass epoxy substrate is fixed to a rear surface of the transparent glass plate 104. The light source 110 is mounted on a lower surface of the substrate portion 107 through a substrate 111 of a light source portion.

Referring to FIGS. 6 and 7, the detailed configuration of the light source portion and the substrate portion will be described below. The substrate 111 of the light source portion is made of a glass epoxy double-side through-hole substrate having four corners which are cut so that the cut four corners correspond to through-holes respectively. That is, because the substrate 111 is shaped so that its four corners are cut, light reflected by the reflecting mirror 106 can be prevented from being blocked. A through-hole is also formed in the center portion of the substrate 111 on which the light-emitting element 112 will be mounted. A hollow portion of the through-hole is filled with metal powder 116 and the through-hole is plated with the metal powder 116. If the light-emitting element 112 is mounted obliquely at the time of auto wire-bonding, the recognition rate is lowered. However, because the through-hole is filled with metal powder 116 and plated with the metal powder 16, sufficient flatness can be obtained so that there is no influence on the operating efficiency of auto wire-bonding.

The light-emitting element 112 is mounted on the plating and electrically connected by a wire 104 in the manner of auto wire-bonding. Thus, a lens 115a shaped like a semi-sphere with the light-emitting element 112 as its origin is formed of a transparent epoxy resin 115. According to this semi-spherical lens 115a, light emitted from the light-emitting element 112 is made perpendicularly incident on the transparent epoxy resin 115 and then radiated out without being refracted. Hence, the apparent light-emitting area of the light source portion can be minimized. The light source portion 110 and the substrate 111 produced in this manner are further placed on the substrate portion 107. The substrate portion 107 is made of a double-side through-hole substrate which is thicker than the substrate 11 and which is cut into a substantially cylindrical shape. The portion extended upward in FIG. 6 is equivalent to a connecting portion 103a of the douser 103. The through-hole of the substrate portion 107 is located just under the portion filled with the metal powder 116, of the substrate 111. The through-hole is filled with solder 117 so that the left side of the substrate 111 and the left side of the substrate portion 107 are electrically connected to each other by the solder 17 and the right side of the substrate 111 and the right side of the substrate portion 107 are electrically connected to each other by the solder 117 while the left side and the right side as a whole are kept electrically insulated from each other. In this manner, the through-hole just under the light-emitting element 112 is filled with metal powder 116 and the through-hole just under the first-mentioned through-hole is further filled with solder 117. Hence, heat generated from the light-emitting element 112 is transmitted through the metal powder 116 and the solder 117 and radiated out. In this manner, the light source 110 is provided as a light source excellent in heat-radiating characteristic.

The surface 107a and cylindrical circumference of the substrate portion 107 are silk-screen-printed in black. Hence, external light which enters the inside of the shielded reflective LED 1 through the optical opening portion 102 shown in FIGS. 4 and 5 is reflected by the reflecting mirror 106. As a result, the reflected light strikes the surface 107a of the substrate portion 107 so as to be absorbed thereto. Hence, pseudo-lighting in which external light reflected by the reflecting mirror 106 is radiated out again through the optical opening portion 102 when the device is turned off can be prevented thoroughly. The LED 101 can be provided as a shielded reflective LED which is high in contrast between light when the device is turned on and light when the device is turned off.

In this manner, there can be provided a shielded reflective LED 1 which is high in external radiation efficiency, high in contrast between light when the device is turned on and light when the device is turned off, and excellent in heat-radiating characteristic; and there can be also provided a light source 110 for the shielded reflective LED 101.

Embodiment 4

Figure 8:
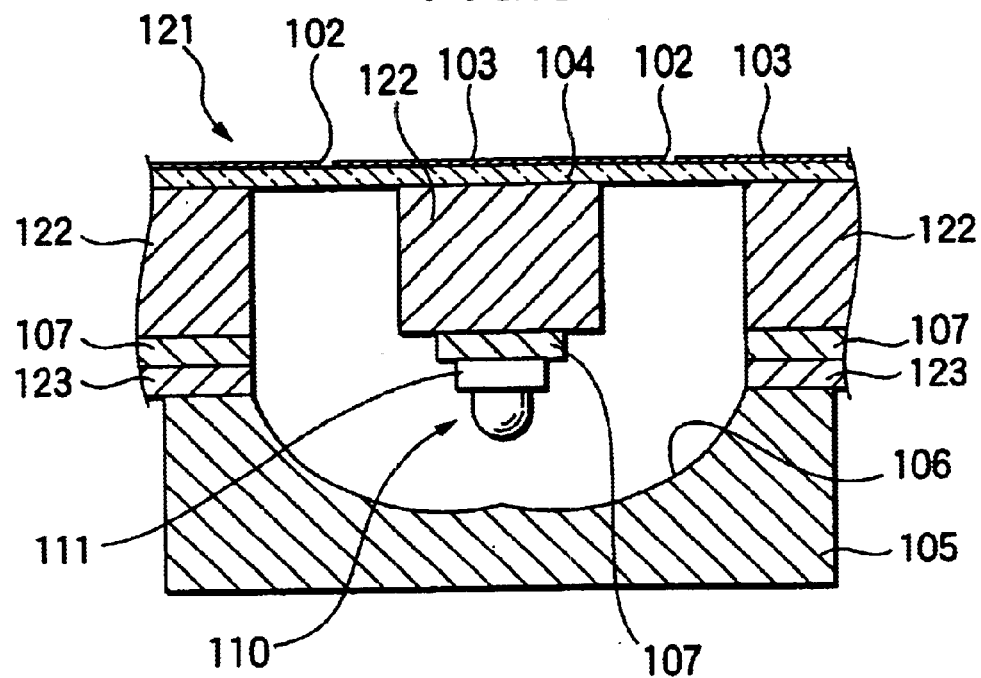
FIG. 8 is a longitudinal sectional view showing a shielded reflective device according to Embodiment 4 of the invention.
Figure 9:
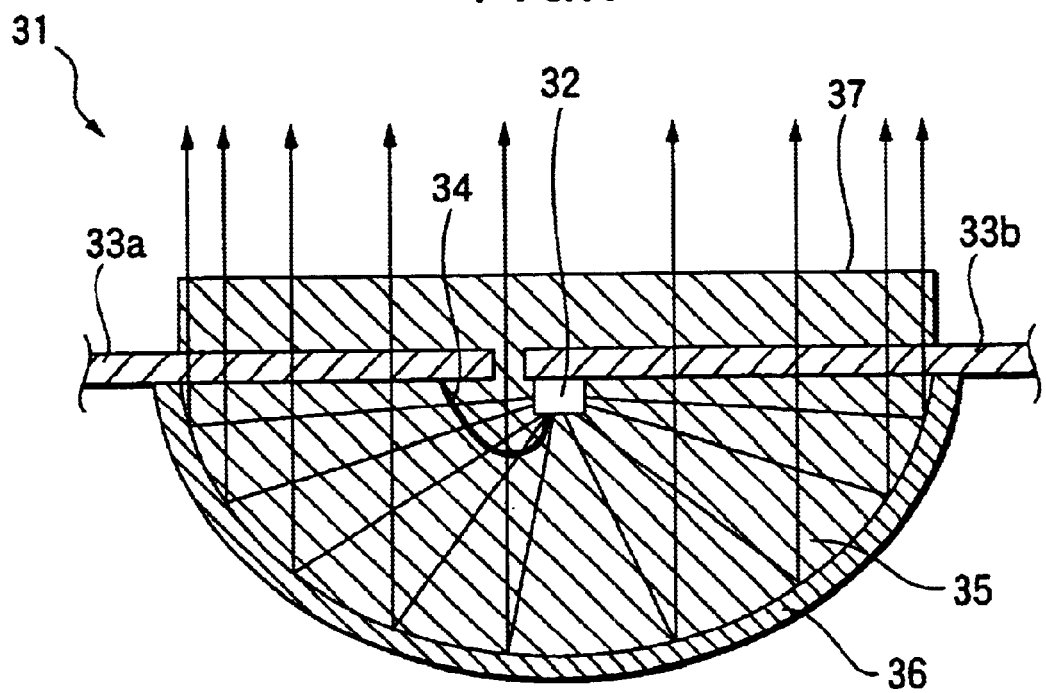
FIG. 9 is a sectional view showing an example of a reflective LED.
Figure 10A:
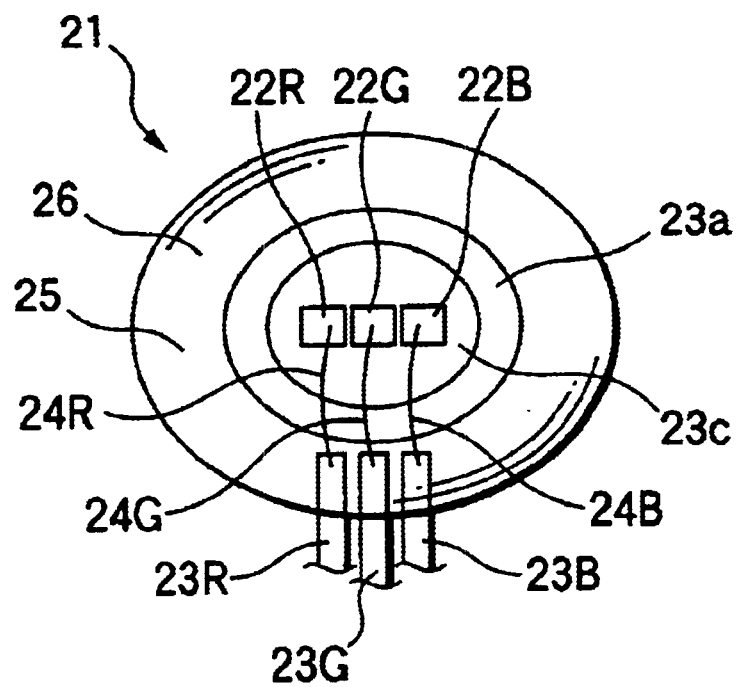
FIG. 10A is a plan view showing the overall configuration of a related-art polychromatic LED.
Figure 10B:
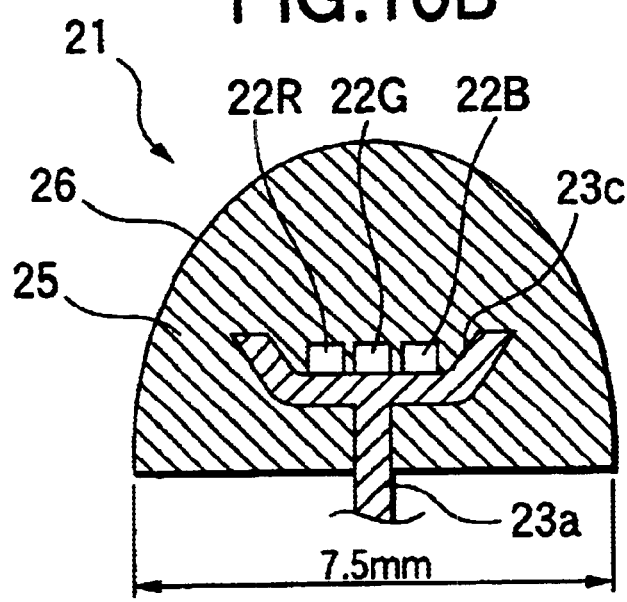
FIG. 10B is a longitudinal sectional view thereof.

Referring to FIG. 8, a shielded reflective LED according to Embodiment 4 of the invention will be described below.

FIG. 8 is a longitudinal sectional view showing the shielded reflective device according to Embodiment 4 of the invention.

The point of difference of the shielded reflective LED 121 according to Embodiment 4 from the shielded reflective LED 101 according to Embodiment 3 is in that a first spacer 122 and a second spacer 123 are put between the glass plate 104 and the through-hole substrate (substrate portion) 107 and between the through-hole substrate 107 and the reflecting substrate 105 respectively. As a result, the focal length from the light source 110 to the optical opening portion 102 can be made so large that characteristic of luminous intensity distribution with high degree of light condensation can be obtained.

The surface of the substrate portion 107, the surface of the first spacer 122 and the surface of the second spacer 123 are silk-screen-printed in black. Hence, external light which enters the inside of the shielded reflective LED 121 through the optical opening portion 102 is reflected by the reflecting mirror 106. The reflected light strikes the surfaces of the substrate portion 107 and the first and second spacers 122 and 123 so as to be absorbed thereto. Hence, pseudo-lighting in which external light reflected by the reflecting mirror 106 is radiated out again through the optical opening portion 102 when the device is turned off can be prevented thoroughly. The shielded reflective LED 121 can be provided as a shielded reflective LED which is high in contrast between light when the device is turned on and light when the device is turned off.

In this manner, there can be provided a shielded reflective LED 121 which is high in external radiation efficiency, high in contrast between light when the device is turned on and light when the device is turned off, and high in degree of light condensation.

Although the embodiments have been described upon shielded reflective LEDs 101 and 121 as examples of shielded reflective devices each using an LED as a light source, the light source portion is not limited to such an LED. For example, the invention may be applied also to a shielded reflective device using any other light source such as an EL or the like as a light source. The LED light-emitting element is suitable for the shielded reflective device because the light-emitting area of the LED light-emitting element is so small that the width of light condensation at the light-condensing portion can be narrowed.

Although the embodiments have been described upon the case where the whole surface of the substrate portion 107 is silk-screen-printed in black, the invention maybe applied also to the case where only the surface 107a of the substrate portion 107 on which the light source portion 110 and the substrate 111 are mounted is printed in black.

Although the embodiments have been described upon the case where the substrate portion is made of a glass epoxy substrate, the invention may be applied also to the case where the substrate portion is made of any other material such as a ceramic substrate or made of a material like a metal stem.

Although the embodiments have been described upon the case where a transparent epoxy resin 115 is used as a light-transmissive material, the invention is not limited thereto. For example, any other material such as a transparent silicone resin may be used as the light-transmissive material.

The other portions of the shielded reflective device and the light source as to the configuration, shape, number of parts, material, size and connection relation thereof are not limited to the embodiments.

Further, the aforementioned all characteristics in each embodiment separately explained can be combined into the possible extent. For example, the black substrate portion, space or heat-dissipation conductive member in the Embodiments 3 and 4 can be incorporated into the shielded reflective light-emitting diode according to the Embodiments 1 and 2.

This invention is not limited to the above description of the mode for carrying out the invention and embodiments thereof at all, and includes various modifications that can be conceived by those skilled in the art without departing from the scope of the claims.

What is claimed is:

1. A shielded reflective light-emitting diode comprising:
   at least one light source including at least one light-emitting element;
   a reflecting mirror provided opposite to said light source; and
   a light-shielding member for limiting external light incident on said reflecting mirror,
   wherein said light-shielding member comprises at least one optical opening portion, and
   wherein said reflecting mirror comprises a cylindrical surface shape in which light emitted from said light source and reflected by said reflecting mirror is condensed linearly such so that the linearly condensed light is radiated out through said at least one optical opening portion of said light-shielding member.

2. The shielded reflective light-emitting diode according to claim 1, wherein said optical opening portion has a size and a shape equivalent to a size and shape of an area of light condensed by said reflecting mirror.

3. The shielded reflective light-emitting diode according to claim 1, wherein said light source further includes a concave reflecting mirror provided around said light-emitting element.

4. The shielded reflective light-emitting diode according to claim 3, wherein said light source further includes a light-transmissive material with which said light-emitting element and said concave reflecting mirror are sealed and which forms a light-radiating surface on a light-emitting surface side of said light-emitting element.

5. The shielded reflective light-emitting diode according to claim 4, wherein said light-radiating surface comprises a convex lens.

6. The shielded reflective light-emitting diode according to claim 4, wherein said light-radiating surface comprises a curved cylindrical surface shaped such so that a top portion of an ellipsoidal convex lens with a major diameter direction facing toward a direction substantially perpendicular to a lengthwise direction of said reflecting mirror shaped like a cylindrical surface is cut in said major diameter direction.

7. The shielded reflective light-emitting diode according to claim 1, wherein said at least one light source comprises a plurality of light sources which are arranged along an axial direction of said reflecting mirror shaped like a cylindrical surface.

8. The shielded reflective light-emitting diode according to claim 1, wherein said at least one light source comprises a plurality of light sources which emit light in different colors respectively.

9. The shielded reflective light-emitting diode according to claim 8, wherein said at least one light source comprises a red light source having a red light-emitting element, a green light source having a green light-emitting element and a blue light source having a blue light-emitting element.

10. The shielded reflective light-emitting diode according to claim 1, further comprising:
a substrate portion for mounting said light source on said light-shielding member, said substrate portion comprising a black side on which said light source is mounted.

11. The shielded reflective light-emitting diode according to claim 10, further comprising:
a black spacer for changing a height of said substrate portion.

12. The shielded reflective light-emitting diode according to claim 1, wherein said light-shielding member is shaped like a film.

13. A shielded reflective device comprising:
a substrate comprising a black side;
a light source portion including a light-emitting portion, and mounted on said black side of said substrate;
a reflecting mirror provided opposite to a light-radiating side of said light source portion; and
a light-shielding member including an optical opening portion.

14. The shielded reflective device according to claim 13, further comprising:
a black spacer for changing a height of said substrate portion.

15. A shielded reflective device comprising:
a light source portion including a light-emitting portion;
a reflecting mirror provided opposite to a light-radiating side of said light source portion; and
a light-shielding member comprising a film shape and including an optical opening portion.

16. A light source comprising:
a light-emitting element formed on a substrate; and
a light-transmissive material with which said light-emitting element is sealed;
wherein a portion of said substrate on which said light-emitting element is mounted comprises a heat-dissipation conductive member which extends to a rear surface of said substrate.

17. The Light source according to claim 16, wherein said light-transmissive material forms a convex lens.

18. The light source according to claim 16, wherein said substrate is shaped so that four corners of said substrate are cut.

19. The tight source according to claim 17, wherein a difference between a width of said substrate and a diameter of said convex lens is no greater than 1 mm.

20. A shielded reflective device comprising:
a light-emitting element;
a light-transmissive material with which said light-emitting element is sealed;
a substrate;
a reflecting mirror provided opposite to a light-radiating said of said light-emitting element; and
a light-shielding member including an optical opening portion,
wherein a portion of said substrate on which said light-emitting element is mounted comprises a heat-dissipation conductive member which extends to a rear surface of said substrate,
wherein said light-transmissive material forms a convex lens, and
wherein a difference between a width of said substrate and a diameter of said convex lens is no greater than 1 mm.

* * * * *